(12) United States Patent
Funakoshi

(10) Patent No.: US 10,319,869 B2
(45) Date of Patent: *Jun. 11, 2019

(54) SOLAR BATTERY, METHOD FOR MANUFACTURING SOLAR BATTERY, METHOD FOR MANUFACTURING SOLAR CELL MODULE, AND SOLAR CELL MODULE

(71) Applicant: Sharp Kabushiki Kaisha, Osaka-shi, Osaka (JP)

(72) Inventor: Yasushi Funakoshi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 109 days.

This patent is subject to a terminal disclaimer.

(21) Appl. No.: 15/064,963

(22) Filed: Mar. 9, 2016

(65) Prior Publication Data
US 2016/0211399 A1 Jul. 21, 2016

Related U.S. Application Data

(62) Division of application No. 12/679,722, filed as application No. PCT/JP2008/065508 on Aug. 29, 2008, now Pat. No. 9,349,896.

(30) Foreign Application Priority Data

Sep. 28, 2007 (JP) ................................ 2007-254403

(51) Int. Cl.
*H01L 31/044* (2014.01)
*H01L 31/05* (2014.01)
(Continued)

(52) U.S. Cl.
CPC ...... *H01L 31/0516* (2013.01); *H01L 31/0201* (2013.01); *H01L 31/049* (2014.12); *Y02E 10/50* (2013.01); *Y10T 156/10* (2015.01)

(58) Field of Classification Search
CPC ........ H01L 31/00–31/078; Y02E 10/50–10/60
(Continued)

(56) References Cited

U.S. PATENT DOCUMENTS 3,994,012 A 11/1976 Warner
5,017,243 A 5/1991 Otsubo
(Continued)

FOREIGN PATENT DOCUMENTS

EP 2109149 A1 10/2009
FR 2877144 4/2006
(Continued)

OTHER PUBLICATIONS

Funakoshi, U.S. Appl. No. 12/679,722, filed Mar. 24, 2010.
(Continued)

*Primary Examiner* — Bach T Dinh
(74) *Attorney, Agent, or Firm* — Nixon & Vanderhye, P.C.

(57) ABSTRACT

The present invention provides a solar battery including a solar cell (100); a wiring substrate (200) having a wire (109, 110) to be electrically connected to an electrode (106, 107) provided in the solar cell (100); and an adhesive agent for adhering the solar cell (100) and the wiring substrate (200) to each other. The present invention also provides a method for manufacturing the solar battery, a method for manufacturing a solar cell module using the solar battery, and the solar cell module.

11 Claims, 8 Drawing Sheets

(51) Int. Cl.
   *H01L 31/049* (2014.01)
   *H01L 31/02* (2006.01)
(58) Field of Classification Search
   USPC .................................................. 136/243–265
   See application file for complete search history.

(56) References Cited

U.S. PATENT DOCUMENTS

| | | | |
|---|---|---|---|
| 5,694,188 A | 12/1997 | Sano et al. | |
| 5,951,786 A | 9/1999 | Gee et al. | |
| 5,972,732 A * | 10/1999 | Gee | H01L 31/048 |
| | | | 136/244 |
| 6,313,396 B1 | 11/2001 | Glenn | |
| 6,344,370 B1 | 2/2002 | Izumi et al. | |
| 6,380,477 B1 | 4/2002 | Curtin | |
| 9,349,896 B2 * | 5/2016 | Funakoshi | H01L 31/048 |
| 2002/0134422 A1 | 9/2002 | Bauman et al. | |
| 2005/0268959 A1 * | 12/2005 | Aschenbrenner | H01L 31/0508 |
| | | | 136/244 |
| 2006/0207646 A1 | 9/2006 | Terreau et al. | |
| 2006/0213548 A1 | 9/2006 | Bachrach et al. | |
| 2007/0012352 A1 | 1/2007 | Wohlgemuth et al. | |
| 2007/0095384 A1 * | 5/2007 | Farquhar | H01L 31/022441 |
| | | | 136/244 |
| 2007/0227580 A1 | 10/2007 | Nakajima | |
| 2007/0227585 A1 | 10/2007 | Yoshimine | |
| 2008/0076307 A1 | 3/2008 | Nishi et al. | |
| 2008/0196757 A1 | 8/2008 | Yoshimine | |
| 2008/0289754 A1 | 11/2008 | Sone et al. | |
| 2009/0065043 A1 * | 3/2009 | Hadorn | B32B 17/10018 |
| | | | 136/244 |
| 2010/0263718 A1 | 10/2010 | Abiko | |
| 2012/0103415 A1 | 5/2012 | Sainoo et al. | |

FOREIGN PATENT DOCUMENTS

| | | |
|---|---|---|
| JP | 62-51285 | 3/1987 |
| JP | 1-120335 | 8/1989 |
| JP | 08-298334 | * 11/1996 |
| JP | 8-298334 | 11/1996 |
| JP | 2001-332753 | 11/2001 |
| JP | 2003-101049 | 4/2003 |
| JP | 2005-175436 | 6/2005 |
| JP | 2005-277055 | 10/2005 |
| JP | 2005-340362 | 12/2005 |
| JP | 2007-019334 | 1/2007 |
| JP | 2008-293798 | 12/2008 |
| WO | 2006045968 | 5/2006 |
| WO | 2007095757 | 8/2007 |
| WO | WO2007/096752 | * 8/2007 |

OTHER PUBLICATIONS

Mikami et al., U.S. Appl. No. 13/574,684, filed Jul. 23, 2012.
International Search Report for PCT/JP2008/065508 dated Oct. 28, 2008.
Shin-Etsu Silicone: One-component RTV Rubber; http://www.silicone.jp/e/products/type/one_rtv/index.shtml. Accessed Apr. 9, 2013.
English-language machine translation Junichi [JP2005-019334].
English-language machine translation Satoshi [JP2005-340362].
English-language machine translation of JP 2008-293798.

* cited by examiner

SOLAR BATTERY, METHOD FOR MANUFACTURING SOLAR BATTERY, METHOD FOR MANUFACTURING SOLAR CELL MODULE, AND SOLAR CELL MODULE

RELATED APPLICATIONS

The instant application is a divisional application of co-pending U.S. patent application Ser. No. 12/679,722, filed Mar. 24, 2010, which is the U.S. national phase of International Application No. PCT/JP2008/065508, filed Aug. 29, 2008, which designated the U.S. and claims priority to JP Application No. 2007-254403, filed Sep. 28, 2007, the entire contents of each of which are incorporated herein by reference.

TECHNICAL FIELD

The present invention relates to a solar battery, a method for manufacturing a solar battery, a method for manufacturing a solar cell module, and a solar cell module, in particular, a solar battery in which electrodes of a solar cell and wires of a wiring substrate can be electrically connected to each other at a low temperature readily to attain highly reliable connection therebetween and relatively good electric characteristics; a method for manufacturing the solar battery; a method for manufacturing a solar cell module using the solar battery; and the solar cell module.

BACKGROUND ART

In recent years, problems of exhaustion of energy resources and global environmental issues such as increasing $CO_2$ in the atmosphere have driven demands for development of clean energy. In particular, utilization of solar batteries for photovoltaic power generation has been developed, been put into practical use, and been expanded as a new energy source.

An exemplary mainstream solar battery of such solar batteries is conventionally a dual-side electrode type solar battery. In the dual-side electrode type solar battery, a monocrystalline or polycrystalline silicon substrate has a light-receiving surface in which an impurity of conductive type opposite to that of the silicon substrate is diffused to form a pn junction. Electrodes are formed on the light-receiving surface and rear surface opposite thereto in the silicon substrate. In recent years, a so-called back-side electrode type solar battery is being developed in which both p type electrodes and n type electrodes are formed in the rear surface of a silicon substrate.

For cost reduction of raw materials, silicon substrates are getting thinner. However, as silicon substrates are getting thinner, solar cells are getting thinner, which disadvantageously results in cracks in cells caused upon operations for wiring the solar cells during fabrication of solar cell modules.

To solve such a problem, for example, Japanese Patent Laying-Open No. 2005-340362 (Patent document 1) proposes a method for wiring solar cells using a wiring substrate configured to include a base material, and wires formed on the base material.

As such, the utilization of a wiring substrate for connections of solar cells is proposed, but it has not been put into practical use yet due to the following problems.

First, in the case where electrodes of a solar cell and wires of a wiring substrate are connected to each other via a solder, when a general lead-free solder (Sn—Ag—Cu-based solder or the like) is used, the solder needs to be heated to around 250° C. Where the solder needs to be heated to such a high temperature to connect the electrodes of the solar cell and the wires of the wiring substrate to each other, stress is generated due to a difference in thermal expansion coefficient between the silicon substrate of the solar cell and the wire material of the wiring substrate during cooling after the high temperature heating, which results in a crack in the solar cell or decreased reliability in the connection therebetween such as removal of the solar cell from the wiring substrate.

Further, when connecting electrodes of a solar cell to wires of a wiring substrate using a solder, it is necessary to perform a step of aligning and positioning the solar cell on the wiring substrate and thereafter heating them using a reflow furnace. However, this step is complicated and a solar cell having a large surface area is likely to be displaced during the reflow, resulting in frequent occurrence of poor connection.

Furthermore, as indicated by Japanese Patent Laying-Open No. 2005-175436 (Patent document 2), it is considered to connect electrodes of a solar cell and wires of a wiring substrate using an ACF (Anisotropic Conductive Film) instead of a solder, but the ACF is expensive, which makes it difficult to use the ACF for a solar cell having a large surface area. In addition, the ACF have too large electric resistance for a large current to flow therein, resulting in decreased electric characteristics of the solar battery such as F.F (Fill Factor).

Patent document 1: Japanese Patent Laying-Open No. 2005-340362

Patent document 2: Japanese Patent Laying-Open No. 2005-175436

DISCLOSURE OF THE INVENTION

Problems to be Solved by the Invention

In view of the above, an object of the present invention is to provide a solar battery in which electrodes of a solar cell and wires of a wiring substrate can be electrically connected to each other at a low temperature readily to attain highly reliable connection therebetween and relatively good electric characteristics; a method for manufacturing the solar battery; a method for manufacturing a solar cell module using the solar battery; and the solar cell module.

Means for Solving the Problems

The present invention provides a solar battery including a solar cell; a wiring substrate having a wire to be electrically connected to an electrode provided in the solar cell; and an adhesive agent for adhering the solar cell and the wiring substrate to each other.

In the solar battery of the present invention, the wiring substrate includes an insulative base material and the wire formed on the insulative base material, the wire is formed of a conductive material, and the adhesive agent is disposed on the insulative base material in at least a part of a region other than a region in which the wire is formed.

Further, in the solar battery of the present invention, the insulative base material preferably includes at least one of polyethylene terephthalate and polyethylene naphthalate.

Further, in the solar battery of the present invention, the insulative base material may also serve as a weather-resistant film.

Further, in the solar battery of the present invention, the wire is preferably formed of a material including at least one selected from a group consisting of copper, aluminum, and silver.

Further, in the solar battery of the present invention, the adhesive agent preferably includes at least one selected from a group consisting of a silicone-based adhesive agent, an acrylic-based adhesive agent, an epoxy-based adhesive agent, and a rubber-based adhesive agent.

Further, in the solar battery of the present invention, the adhesive agent preferably has stable adhesiveness even when exposed to an environment at a temperature of 150° C. or greater.

Further, in the solar battery of the present invention, the adhesive agent is preferably a viscous adhesive agent.

Further, in the solar battery of the present invention, the solar cell is preferably a back-side electrode type solar cell.

Further, in the solar battery of the present invention, the electrode of the solar cell preferably has a shape of at least one of a strip and a dot.

Further, in the solar battery of the present invention, the electrode of the solar cell and the wire of the wiring substrate may be electrically connected to each other via a conductive adhesive agent.

Here, in the solar battery of the present invention, the conductive adhesive agent preferably has a melting temperature/hardening temperature of 180° C. or smaller.

Further, in the solar battery of the present invention, the conductive adhesive agent preferably has an electric resistivity of 0.001 Ωcm or smaller.

Further, in the solar battery of the present invention, the conductive adhesive agent is preferably an Sn—Bi-based solder.

Furthermore, the present invention provides a method for manufacturing the solar battery, including the steps of: disposing a viscous adhesive layer on a base material; disposing the wire on the viscous adhesive layer; disposing the wire, disposed on the viscous adhesive layer, on the adhesive agent disposed on the insulative base material; and removing the wire from the viscous adhesive layer to transfer the wire onto the adhesive agent.

Furthermore, the present invention provides a method for manufacturing the solar battery, including the steps of: applying the adhesive agent to at least one of the solar cell and the wiring substrate; and adhering the solar cell and the wiring substrate using the adhesive agent. Here, the adhesive agent is applied using any of screen-printing, offset printing, inkjet printing, and a dispenser.

Furthermore, the present invention provides a method for manufacturing a solar cell module in which the solar battery is sealed in a sealing material, wherein when sealing the solar battery, the electrode of the solar cell and the wire of the wiring substrate are mechanically compressed and bonded.

Furthermore, the present invention provides a method for manufacturing a solar cell module in which the solar battery is sealed in a sealing material, wherein when sealing the solar battery, the electrode of the solar cell and the wire of the wiring substrate are mechanically compressed and bonded with the conductive adhesive agent interposed therebetween.

Furthermore, the present invention provides a solar cell module in which the solar battery is sealed in a sealing material, wherein the sealing material is contained in a container having, on at least one of its bottom portion and its side wall, a moisture penetration preventing layer for preventing penetration of moisture.

Effects of the Invention

According to the present invention, there can be provided an inexpensive solar battery in which electrodes of a solar cell and wires of a wiring substrate are electrically connected to each other at a low temperature readily to attain highly reliable connection therebetween and relatively good electric characteristics; a method for manufacturing a solar cell module using the solar battery; and the solar cell module.

DESCRIPTION OF THE REFERENCE SIGNS

Figure 1:
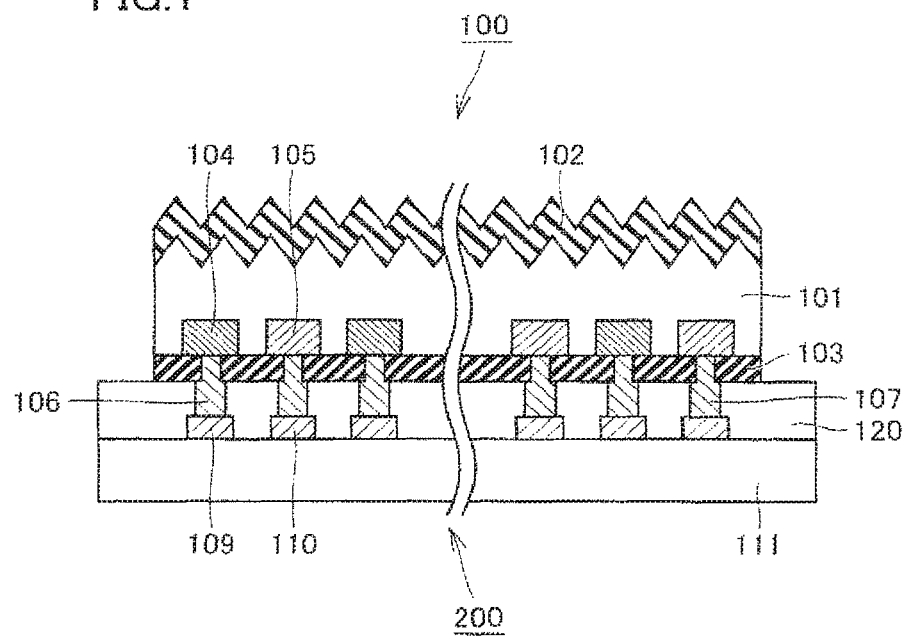
FIG. 1 is a schematic cross sectional view of one exemplary solar battery of the present invention.

100: solar cell; 101: silicon substrate; 102: anti-reflection film; 103: passivation film; 104: n type impurity doping region; 105: p type impurity doping region; 106: n electrode; 107: p electrode; 108: conductive adhesive agent; 109: wire for n type; 110: wire for p type; 111: insulative substrate; 112: slit; 113: connection electrode; 114: busbar p electrode; 115: busbar n electrode; 116: conductive member; 120: adhesive agent; 121: base material; 122: hardening resin; 124: transparent substrate; 125: sealing material; 126: insulative film; 127: metal film; 128: container; 200: wiring substrate.

BEST MODES FOR CARRYING OUT THE INVENTION

An embodiment of the present invention will be described below. In the drawings of the present invention, the same reference characters indicate the same or equivalent portions.

FIG. 1 shows a schematic cross sectional view of one exemplary solar battery of the present invention. The solar battery shown in FIG. 1 has solar cells 100 and a wiring substrate 200. Each of solar cells 100 has an n type or p type silicon substrate 101. Silicon substrate 101 has a light-receiving surface (surface of a side via which sunlight mainly enter) on which an anti-reflection film 102 is formed and has a rear surface (surface opposite to the light-receiving surface) in which n type impurity doping regions 104 formed by diffusing an n type impurity and p type impurity doping regions 105 formed by diffusing a p type impurity are provided alternately with a predetermined space therebetween.

Provided on the rear surface of silicon substrate 101 is a passivation film 103. N electrodes 106 penetrating through contact holes formed in passivation film 103 are formed to make contact with n type impurity doping regions 104, and p electrode 107 penetrating therethrough are formed to make contact with p type impurity doping regions 105.

Wiring substrate 200 has an insulative substrate 111 as well as wires for n type 109 and wires for p type 110 both formed on insulative substrate 111.

Further, n electrodes 106 of solar cell 100 are electrically connected to wires for n type 109 of wiring substrate 200, whereas p electrodes 107 are electrically connected to wires for p type 110 of wiring substrate 200.

Here, a feature of the solar battery of the present invention lies in that the connection between n electrodes 106 of solar cell 100 and wires for n type 109 of wiring substrate 200 and the connection between p electrodes 107 and the wires for p type 110 of wiring substrate 200 are achieved through adhesion provided by an adhesive agent 120 between solar cell 100 and wiring substrate 200.

Since solar cell 100 and wiring substrate 200 are fixed to each other by means of the adhesion provided by adhesive agent 120 between solar cell 100 and wiring substrate 200 as such, solar cell 100 can be fixed onto wiring substrate 200 only by aligning and disposing solar cell 100 on wiring substrate 200. Thereafter, for example, the solar battery thus obtained is sealed in a sealing material such as a resin to fabricate a solar cell module. In this way, good electric connection through mechanical compression bonding is achieved. By fabricating the solar cell module in this way, they are less likely to be displaced from each other after the solar cell is placed on the wiring substrate using the adhesive agent. As such, the step of connecting using a solder, which requires heating at approximately 250° C., can be omitted, thus readily realizing highly reliable connection at a low temperature. Further, since n electrodes 106 of solar cell 100 and wires for n type 109 of wiring substrate 200 are in direct contact with each other and p electrodes 107 of solar cell 100 and wires for p type 110 of wiring substrate 200 are also in direct contact with each other, electric resistance at the connection portions can be reduced as compared with the case where they are connected using an ACF, thereby achieving relatively good electric characteristics of the solar battery such as F.F.

Figure 2:
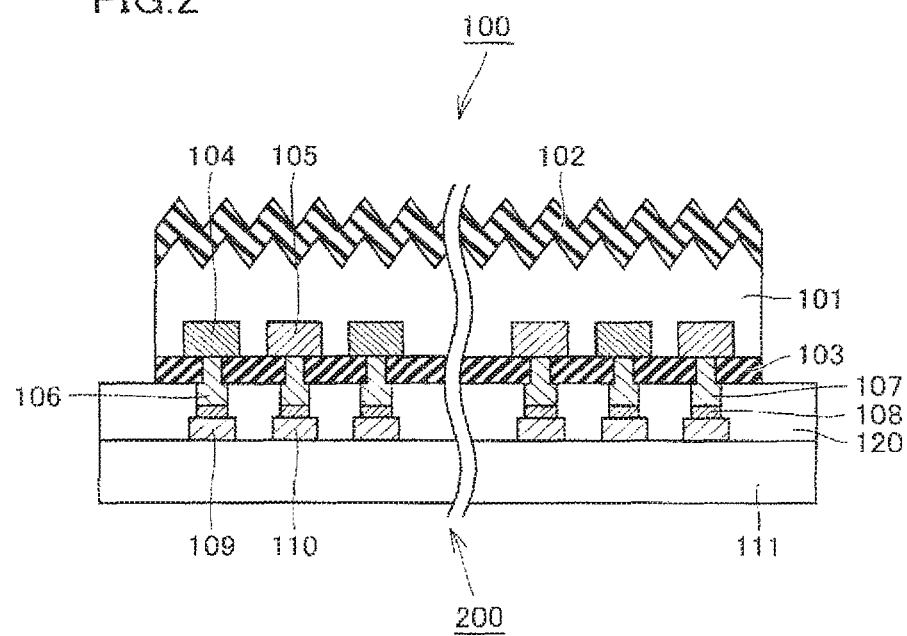
FIG. 2 is a schematic cross sectional view of one exemplary solar battery of the present invention.

FIG. 2 shows a schematic cross sectional view of another exemplary solar battery of the present invention. The solar battery shown in FIG. 2 is different from the solar battery shown in FIG. 1 in that the connection between n electrodes 106 of solar cell 100 and wires for n type 109 of wiring substrate 200 and the connection between p electrodes 107 of solar cell 100 and wires for p type 110 of wiring substrate 200 are achieved using a conductive adhesive agent 108.

Also in the solar battery shown in FIG. 2, solar cell 100 and wiring substrate 200 are fixed to each other by adhesive agent 120 provided therebetween. Where a solder is used as the conductive adhesive agent 108, for example, conductive adhesive agent 108 may be provided and thereafter they may be heated in a reflow furnace and accordingly connected to each other.

In the solar battery shown in FIG. 2, it is very beneficial to use as conductive adhesive agent 108, for example, an Sn—Bi-based solder, which has a low melting point, is inexpensive, and has a low electric resistance. The Sn—Bi-based solder is adhered in advance to at least one of each electrode of solar cell 100 and each wire of wiring substrate 200, and solar cell 100 is placed on wiring substrate 200. Solar cell 100 and wiring substrate 200 are fixed to each other by adhesive agent 120. Thereafter, they are not heated in a reflow furnace or the like, and are sealed in a sealing material as with the description above. The step of heating using a reflow furnace can be omitted because heat generated during the process of sealing and mechanical compression bonding provided by the sealing securely achieve electric connection with conductive adhesive agent 108 interposed therebetween. This holds true for a case where a conductive adhesive agent of low-temperature hardening type (including a conductive adhesive agent other than a solder) different from the Sn—Bi-based solder is used as conductive adhesive agent 108.

For example, as shown in FIG. 1 and FIG. 2, by fixing solar cell 100 to wiring substrate 200 using adhesive agent 120, the connection locations of solar cell 100 and wiring substrate 200 can be prevented from being displaced from each other during a period of time until the solar battery is sealed in the sealing material to complete the fabrication of the solar cell module. In this way, highly reliable connection is achieved. Further, it can be expected to reinforce the connection between solar cell 100 and wiring substrate 200 after the solar battery is sealed.

As adhesive agent 120, any material can be used without a particular limitation as long as it is capable of adhering solar cell 100 and wiring substrate 200 to each other. For example, a material usable therefor is a material containing at least one selected from a group consisting of a silicone-based adhesive agent, an acrylic-based adhesive agent, an epoxy-based adhesive agent, and a rubber-based adhesive agent, each of which has a high heat resistance. Here, the silicone-based adhesive agent, the acrylic-based adhesive agent, the epoxy-based adhesive agent, and the rubber-based adhesive agent that can be used herein are, for example, conventionally known ones.

Further, it is preferable to use a viscous adhesive agent as adhesive agent 120. When a viscous adhesive agent is used as adhesive agent 120, stress can be absorbed due to flexibility of the viscous adhesive material to avoid poor connection between solar cell 100 and wiring substrate 200. In addition, cracks in solar cell 100 are likely to be effectively prevented. Further, even if the connection locations of solar cell 100 and wiring substrate 200 are displaced from each other, solar cell 100 and wiring substrate 200 can be detached from each other and then can be connected again to each other, advantageously. It should be noted that a viscous adhesive agent is one type of adhesive agent, which has viscosity in general, has fluidity against an adhered material under application of pressure, and has retention power provided by aggregation against removal instead of hardening.

Furthermore, in order to seal the solar battery, the solar battery needs to be heated. Hence, for adhesive agent 120, it is preferable to use an adhesive agent exhibiting stable adhesiveness even when exposed to an environment at a temperature of 150° C. or greater, and it is more preferable to use one exhibiting stable adhesiveness even when exposed to an environment at a temperature of 180° C. or greater.

The "stable adhesiveness" described above indicates such adhesiveness that provides viscosity even under application of heat and does not cause displacement of the solar cell and the wiring substrate even when an impact such as vibration is applied. Further, the adhesive agent preferably has stable adhesiveness after the heating, and preferably secures the electric connection therebetween by adhering the solar cell and the wiring substrate to each other.

Specifically, exemplary adhesive agents exhibiting stable adhesiveness when exposed to an environment at a temperature of 180° C. or greater are SD4570, which is a silicone-based adhesive agent, provided by the Dow Corning Corporation; 9079, which is an acrylic-based adhesive agent, provided by the Sumitomo 3M Limited; C-1080A/B, which is an epoxy-based adhesive agent, provided by the Nacalai Tesuque, Inc; and the like. Another exemplary adhesive agent is DB5441, which is a screen-printable acrylic-based adhesive agent (viscous adhesive agent), provided by the Diabond Industry Co., Ltd, or the like, and can be patterned and formed on the base material of wiring substrate 200 and/or portions of solar cell 100 other than the electrodes. They exhibit stable adhesiveness even when exposed to an environment at a temperature of 150° C. or greater. Further, a viscous tape can be used which has a PET base material or PEN base material to which an adhesive agent (viscous adhesive agent) is applied in advance. Examples thereof are PET tape YT153S, which employs a PET base material and a silicone-based adhesive agent, provided by the YOUNG-WOO CO., LTD.; a tape No. 754, which employs a PET base material and an acrylic-based adhesive agent, provided by the Sumitomo 3M Limited; a tape No. 4734, which employs a PET base material and a rubber-based adhesive agent, provided by the Sumitomo 3M Limited; and T4900, G9052, etc., which are acrylic-based viscous adhesive agents (double-sided tape), provided by the Sony Chemicals Corporation. These exhibit stable adhesiveness even when exposed to an environment at a temperature of 150° C. or greater.

Further, adhesive agent 120 is preferably provided in at least a portion of wiring substrate 200 other than the wires.

Furthermore, as insulative substrate 111 used for wiring substrate 200, for example, a substrate made of a material having an electric resistance higher than those of wires for n type 109 and wires for p type 110 can be used. However, in the present invention, since the electrodes of solar cell 100 and the wires of wiring substrate 200 can be connected to each other at a low temperature, it is preferable to use PEN (polyethylene naphthalate) and/or PET (polyethylene terephthalate) therefor. When PEN or PET is used as insulative substrate 111 of wiring substrate 200, its material cost is not so expensive, whereby the cost of manufacturing the solar battery is likely to be reduced.

As wires for n type 109 and wires for p type 110 used in wiring substrate 200, any material can be used without a particular limitation as long as it is made of a conductive material. However, for further reduction in electric resistance of the wires, they are preferably formed of a material including at least one selected from a group consisting of copper, aluminum, and silver. It should be noted that wires for n type 109 and wires for p type 110 may be formed of the same material or different materials.

As conductive adhesive agent 108, for example, agents made of a conductive material can be used. Among them, it is preferable to use one having its melting temperature or hardening temperature of 180° C. or smaller, more preferably, of 150° C. or smaller. For simplification of steps, conductive adhesive agent 108 is preferably melted or hardened in the step of sealing the solar battery because the step of sealing is normally performed at a temperature of 180° C. or smaller. Furthermore, when conductive adhesive agent 108 has a melting temperature or hardening temperature of 180° C. or smaller and for example a PEN film is used for insulative substrate 111 of wiring substrate 200, insulative substrate 111 is hardly shrunk by heat. Likewise, when conductive adhesive agent 108 has a melting temperature or hardening temperature of 150° C. or smaller and for example a PET film is used for insulative substrate 111 of wiring substrate 200, insulative substrate 111 is hardly shrunk by heat.

It should be noted that the melting temperature of conductive adhesive agent 108 refers to a temperature at which conductive adhesive agent 108 starts to be melted, and the hardening temperature of conductive adhesive agent 108 refers to a temperature at which conductive adhesive agent 108 starts to be hardened.

As conductive adhesive agent 108, it is preferable to use an Sn—Bi-based solder. Sn—Bi-based solder used for conductive adhesive agent 108 is melted at a low temperature of, for example, approximately 140-150° C., is therefore processed at a low temperature, is available at an inexpensive price, is easy in handling, and provides a low electric resistance to conductive adhesive agent 108. Here, the Sn—Bi-based solder refers to a solder containing Sn and Bi as main components among metals constituting the solder, the total mass of Sn and Bi being 90% by mass or greater of the entire mass of the solder.

For better electric characteristics of the solar battery, conductive adhesive agent 108 preferably has an electric resistivity of 0.001 Ωcm or smaller.

In the present invention, as the solar cell, it is preferable to use, for example, a back-side electrode type solar cell configured to have both n electrodes and p electrodes formed only on the rear surface of a semiconductor substrate such as a silicon substrate as shown in FIG. 1 or FIG. 2. It should be noted that as members constituting the solar cell, for example, conventionally known members can be used.

Figure 3A:
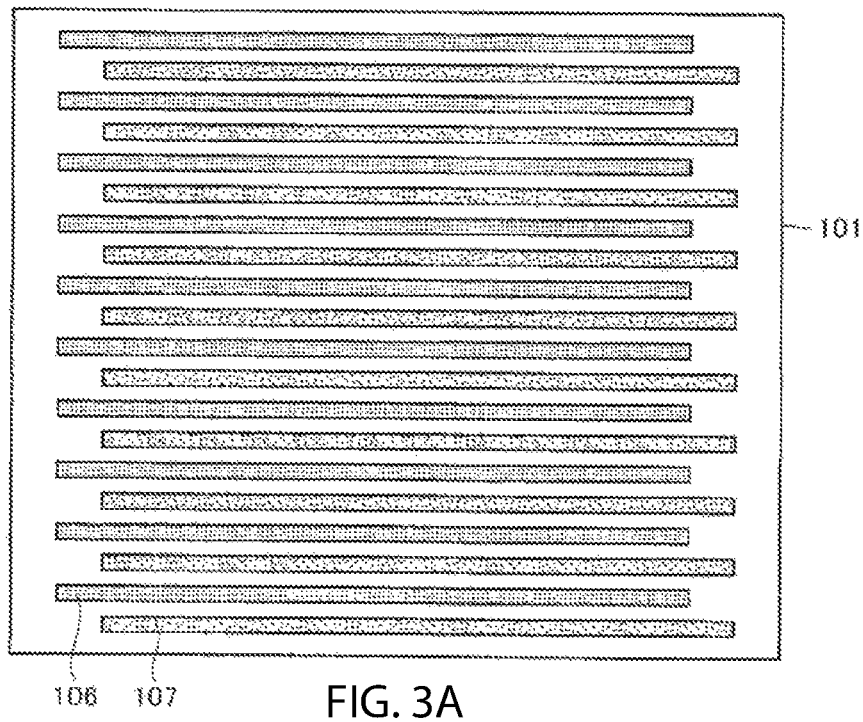
FIG. 3A is a schematic planar view of one exemplary rear surface of the solar cell used in the solar battery of the present invention.

FIG. 3A shows a schematic planar view of one exemplary rear surface of the solar cell used in the present invention. On the rear surface of silicon substrate 101, n electrodes 106 and p electrodes 107 are formed to have shapes of strips extending in the same direction in the rear surface of silicon substrate 101 (the left-right direction of the plane of FIG. 3A). Such strip-shaped n electrodes 106 and p electrodes 107 are arranged alternately one by one in the top-bottom direction of the plane of FIG. 3A.

Figure 3B:
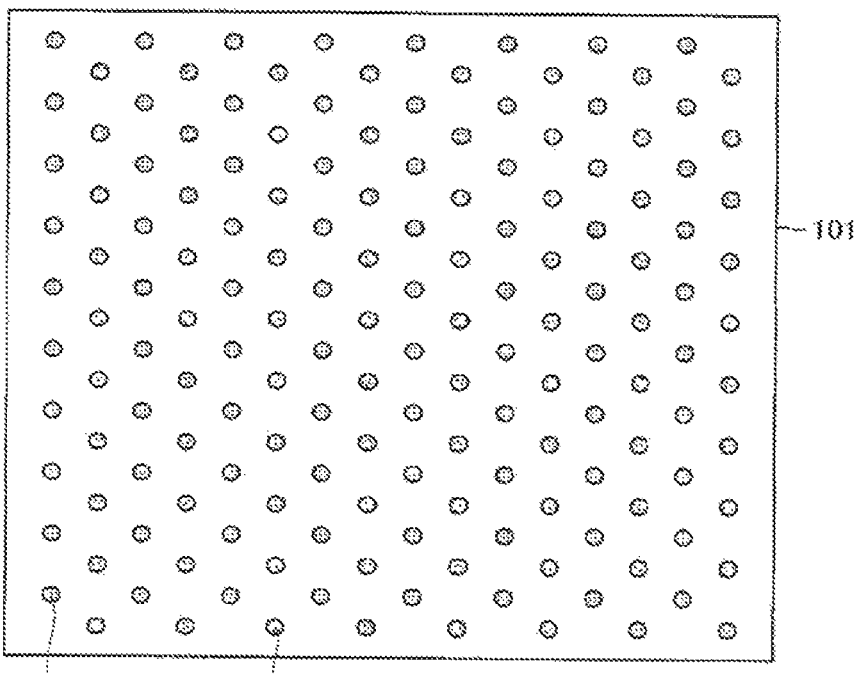
FIG. 3B is a schematic planar view of another exemplary rear surface of the solar cell of the solar battery of the present invention.

FIG. 3B shows a schematic planar view of another exemplary rear surface of the solar cell used in the present invention. On the rear surface of silicon substrate 101, n electrodes 106 and p electrodes 107 are formed to have shapes of dots. In the top-bottom direction and left-right direction of the plane of FIG. 3B, such dot-shaped n electrodes 106 are arranged adjacent to one another and dot-shaped p electrodes 107 are arranged adjacent to one another. Dot-shaped n electrodes 106 and dot-shaped p electrodes 107 shown in FIG. 3B are arranged in straight lines in the top-bottom direction and left-right direction in the plane of FIG. 3B.

Each of n electrodes 106 and p electrodes 107 on the rear surface of the solar cell preferably has a shape such as the strip as illustrated in FIG. 3A and/or a shape such as the dot as illustrated in FIG. 3B. In these cases, voids are less likely to be left between the solar cell and the wiring substrate upon sealing the solar battery in a sealing material as described below.

Figure 4:
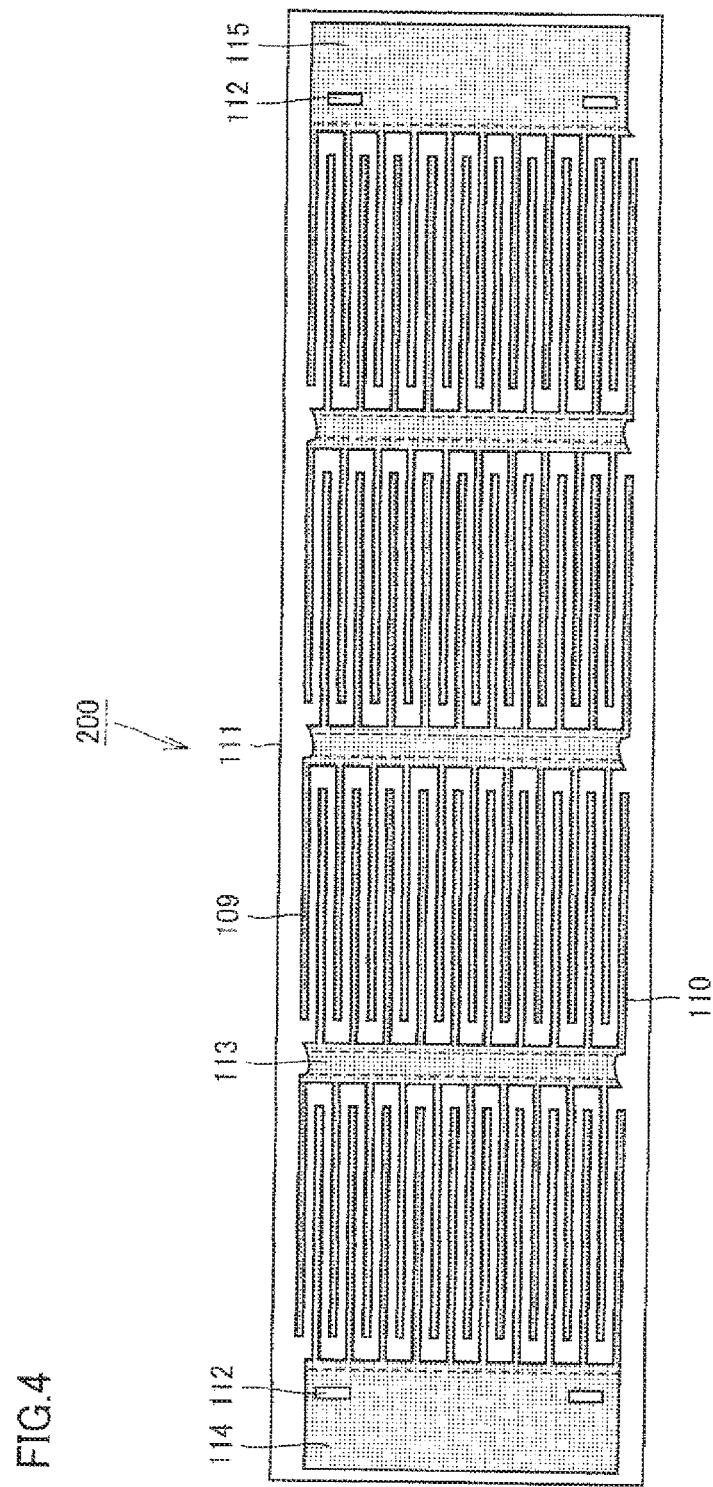
FIG. 4 is a schematic planar view of one exemplary wiring substrate used in the solar battery of the present invention.

FIG. 4 shows a schematic planar view of one exemplary wiring substrate used in the present invention. Here, insulative substrate 111 of wiring substrate 200 has a surface provided with wires for n type 109 and wires for p type 110 as well as connection electrodes 113 for electrically connecting wires for n type 109 and wires for p type 110 to each other.

Further, a busbar p electrode 114 for collecting charges is electrically connected to wires for p type 110 provided at one end of insulative substrate 111 in the longitudinal direction, whereas a busbar n electrode 115 for collecting charges is electrically connected to wires for n type 109 provided at the other end thereof.

Furthermore, the adhesive agent (not shown) is provided in at least a part of regions on the surface of insulative substrate 111 other than wires for n type 109, wires for p type 110, connection electrodes 113, busbar p electrode 114, and busbar n electrode 115.

On both busbar p electrode 114 and busbar n electrode 115, slits 112 are provided to serve as openings for positioning.

It should be noted that in FIG. 4, the respective regions of wires for n type 109, wires for p type 110, connection electrodes 113, busbar p electrode 114, and busbar n electrode 115 are divided by dotted lines but the regions are not limited to those divided as shown in FIG. 4.

Figure 5A:
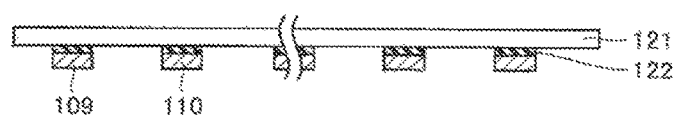
FIGS. 5A-5C are schematic cross sectional views each illustrating one exemplary method for fabricating the wiring substrate used in the solar battery of the present invention.

Referring to schematic cross sectional views of FIG. 5A-5C, one exemplary method for manufacturing the wiring substrate used in the present invention will be described below. As shown in FIG. 5A, on a surface of an appropriate base material 121, hardening resins 122 are applied. On the surfaces of hardening resins 122, for example, conductive sheets such as copper foils are adhered. Each of the conductive sheets is etched to have a predetermined shape, thus forming wires for n type 109 and wires for p type 110. An exemplary hardening resin used as each of hardening resins 122 is a conventionally known hardening resin of a type which loses viscosity by heating and/or UV (ultraviolet radiation).

Figure 5B:
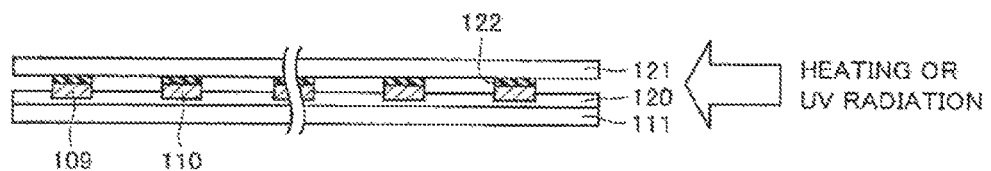

Next, as shown in FIG. 5B, base material 121 thus provided with wires for n type 109 and wires for p type 110 fabricated as above is attached and adhered to insulative substrate 111 on which adhesive agent 120 is provided. Interfaces between hardening resins 122 on base material 121 and each of wires for n type 109 and wires for p type 110 are heated and/or subjected to UV radiation. Accordingly, hardening resins 122 lose their viscosity, and wires for n type 109 and wires for p type 110 are removed from hardening resins 122.

Figure 5C:
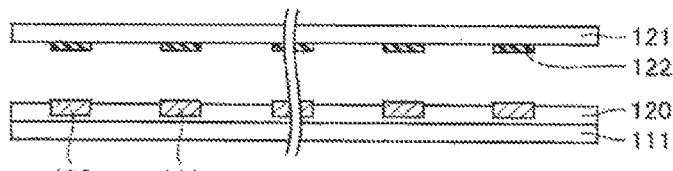

Thereafter, as shown in FIG. 5C, base material 121 is separated therefrom to transfer wires for n type 109 and wires for p type 110 to adhesive agent 120 on the surface of insulative substrate 111. In this way, the wiring substrate can be formed which has a configuration in which adhesive agent 120 is exposed in at least a portion of a region on the surface of insulative substrate 111 other than wires for n type 109 and wires for p type 110.

In the description above, depending on a material of adhesive agent 120, hardening resins 122 may be heated and/or subjected to UV radiation before base material 121 and insulative substrate 111 are attached and adhered to each other.

Further, base material 121 from which wires for n type 109 and wires for p type 110 have been transferred to adhesive agent 120 is reusable as a member for the solar cell module fabricated by sealing the solar battery in the sealing material.

Figure 6:
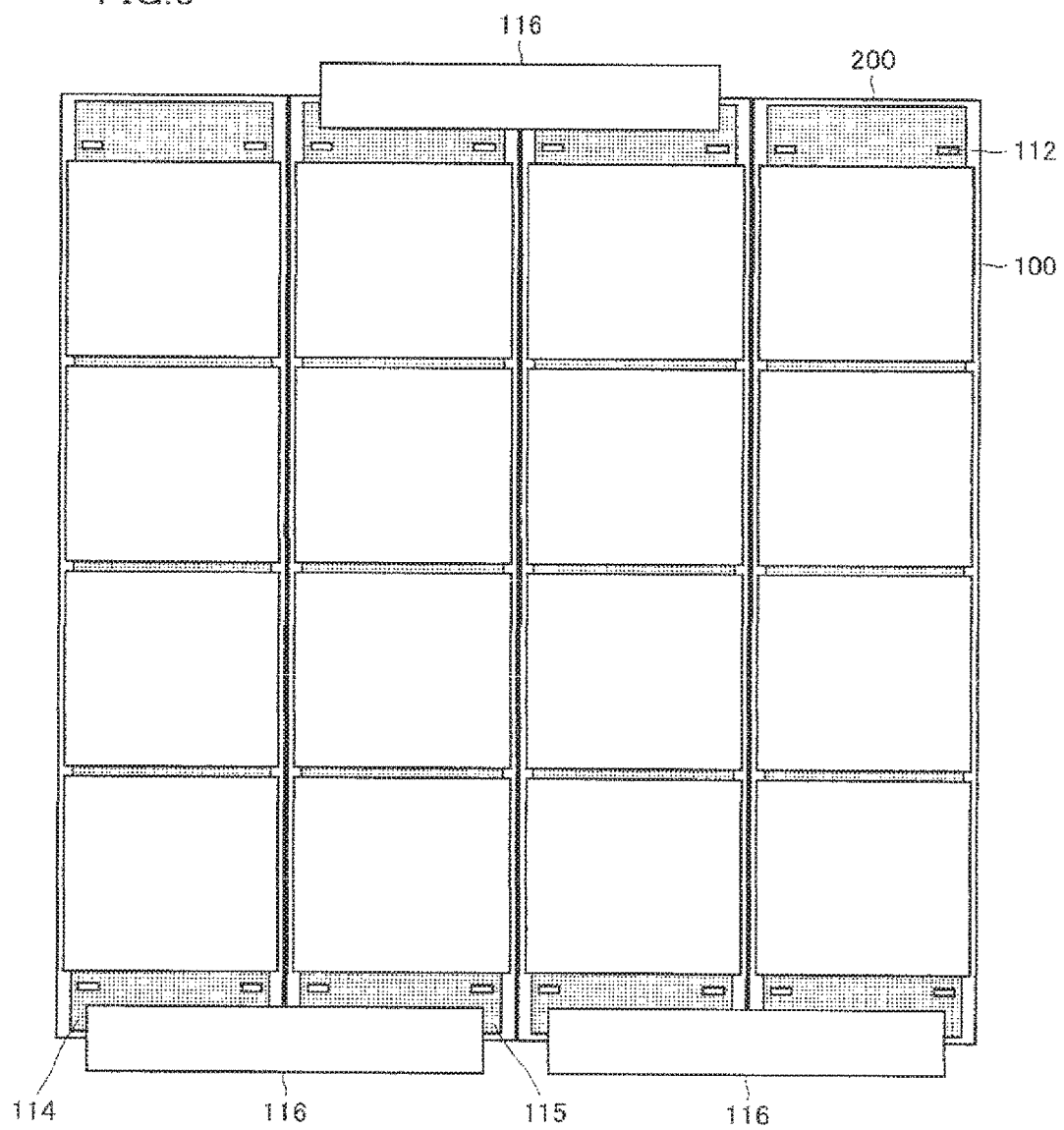
FIG. 6 is a schematic planar view of one exemplary solar battery of the present invention.

FIG. 6 shows a schematic planar view of one exemplary solar battery of the present invention, which is fabricated by, for example, installing solar cells on wiring substrates on which the adhesive agent is provided. For alignment of the installation locations of solar cells 100 on wiring substrates 200, slits 112 may be used.

In an embodiment shown in FIG. 6, in order to electrically connect neighboring two wiring substrates 200 to each other, busbar p electrode 114 of one wiring substrate 200 and busbar n electrode 115 of the other wiring substrate 200 are electrically connected to each other by conductive members 116. Alternatively, for example, there may be adopted such a configuration that does not employ conductive members 116 but allows solar cells 100 to be electrically connected in series naturally when placing solar cells 100 on a wiring substrate 200, such as the wire pattern of wiring substrate 200 in an embodiment shown in FIG. 7. In this case, insulative substrate 111, which serves as a base material for wiring substrate 200, may be used to also serve as a weather-resistant film.

Figure 8A:
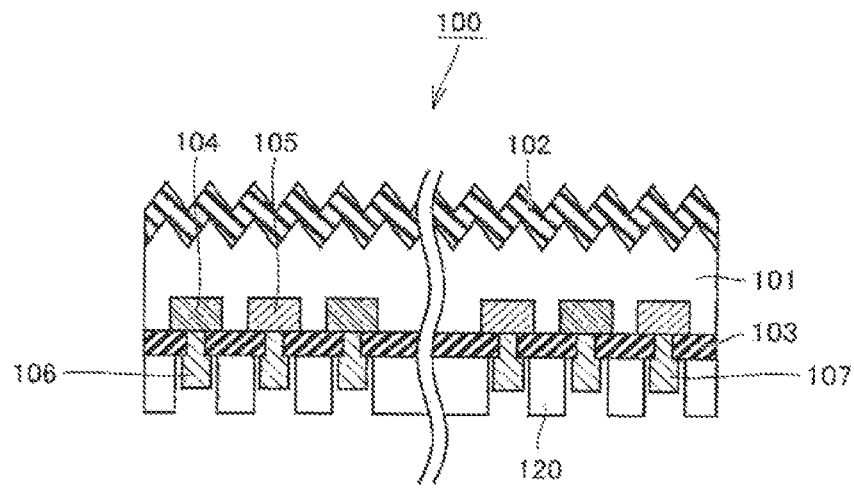
FIGS. 8A and 8B are schematic cross sectional views each illustrating one exemplary method for manufacturing the solar battery of the present invention.
Figure 8B:
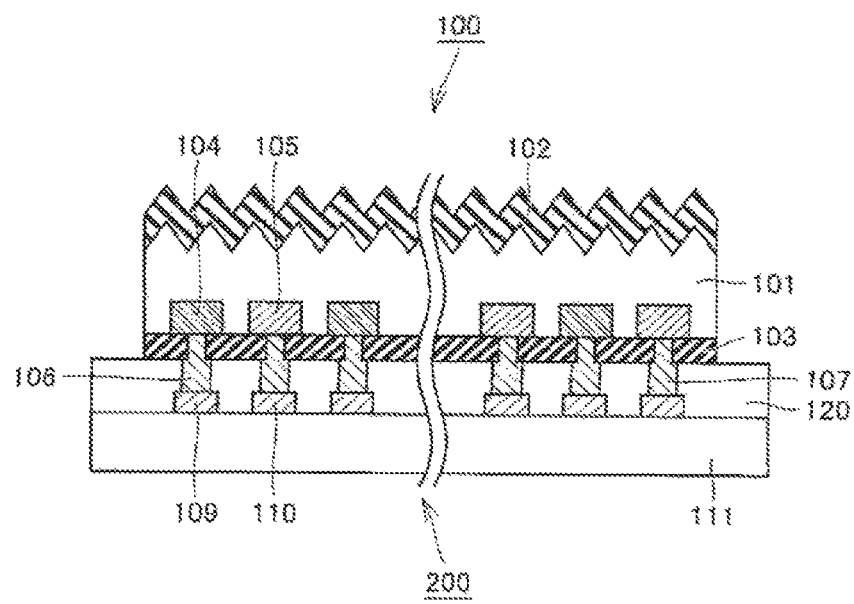

Referring to FIGS. 8A and 8B, another exemplary method for connecting to the wiring substrate will be described. First, as shown in FIG. 8A, a screen-printable adhesive agent 120 is pattern-printed on portions of the rear surface of solar cell 100 other than the electrodes. Although adhesive agent 120 may be printed on the wiring substrate 200 side, it is preferable to print it on the solar cell 100 side due to the following reasons: the electrodes of solar cell 100 can be thinner than the wires of wiring substrate 200 and the portions other than the electrodes therefore have large areas, which makes it easier to print thereon; and it is easier to perform an operation of baking adhesive agent 120 as solar cell 100 is smaller in size. Then, after baking adhesive agent 120, as shown in FIG. 8B, solar cell 100 and wiring substrate 200 are placed on each other so that the electrodes of solar cell 100 match with the wires of wiring substrate 200, and are adhered to each other.

Other method than the above can be employed as follows. That is, adhesive agent 120 is applied using a dispenser or the like onto the surface of insulative substrate 111 on which wires for n type 109 and wires for p type 110 are patterned and/or the rear surface of solar cell 100, and then solar cell 100 is placed on wiring substrate 200.

Figure 9:
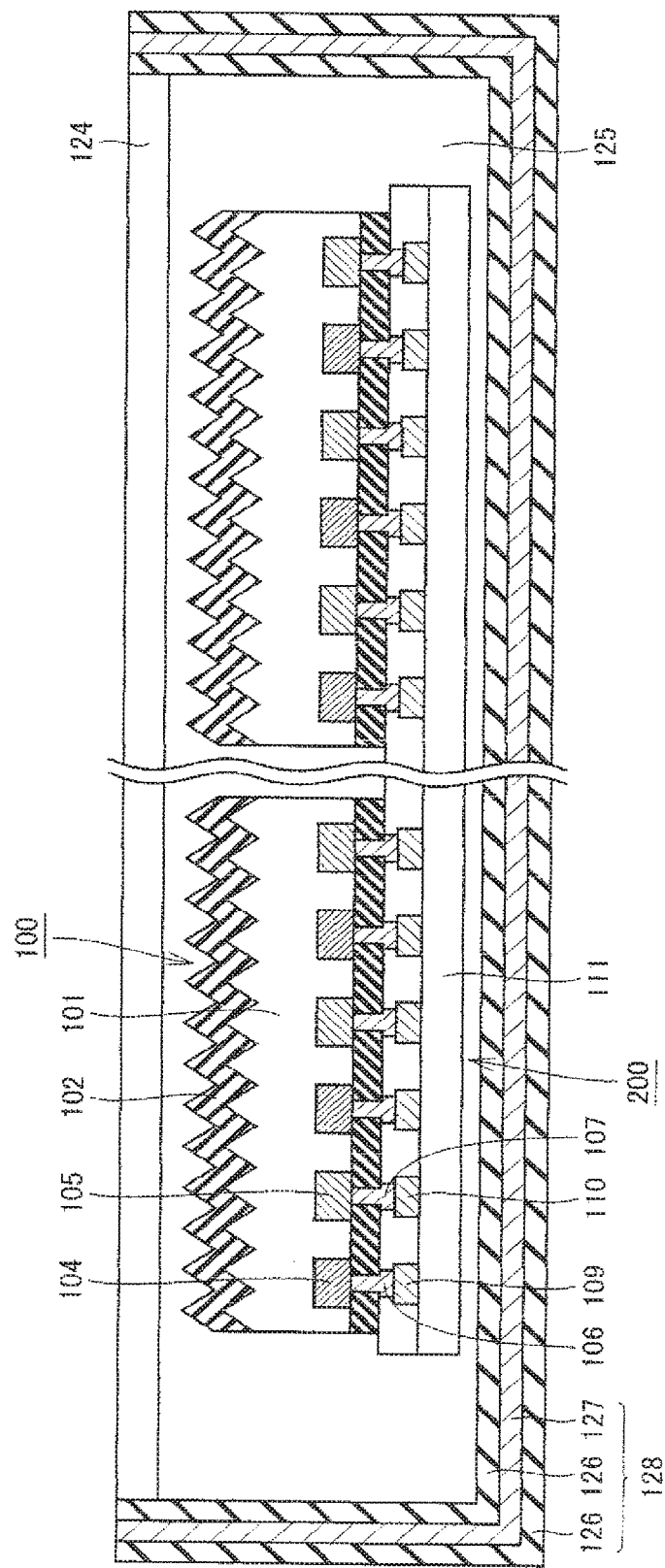
FIG. 9 is a schematic cross sectional view of one exemplary solar cell module of the present invention.

FIG. 9 shows a schematic cross sectional view of one exemplary solar cell module of the present invention, which is fabricated by, for example, sealing the solar battery in a sealing material. Here, the solar battery having solar cells 100 placed on wiring substrate 200 is sealed in sealing material 125 contained in a container 128 constituted by a layered film formed by interposing a metal film 127 between opposing two insulative films 126. Sealing material 125 has a surface provided with a transparent substrate 124.

As transparent substrate 124, for example, a substrate transparent to sunlight can be used such as a conventionally known glass substrate. As sealing material 125, for example, a resin or the like transparent to sunlight can be used such as a conventionally known EVA (ethylene vinyl acetate) resin.

As each of insulative films 126, for example, a conventionally known one can be used such as a PET film. Further, when container 128 is used as insulative substrate 111 serving as the base material of wiring substrate 200, the insulative substrate of wiring substrate 200 can be used as a weather-resistant film without modification. Further, as metal film 127, for example, a conventionally known one can be used such as a metal film of aluminum or the like.

Here, before sealing the solar battery, solar cell 100 is placed on wiring substrate 200. Upon sealing the solar battery, it is preferable to mechanically compress and bond the electrodes of solar cell 100 (n electrodes 106 and p electrodes 107) and the wires of wiring substrate 200 (wires for n type 109 and wires for p type 110). In this way, the electric connection between the electrodes of solar cell 100 and the wires of wiring substrate 200 can be secured more, thus achieving further improved reliability in the connection.

Here, the solar battery can be sealed in sealing material 125 using, for example, a method including a step of compressing and bonding sealing material 125 and a step of hardening sealing material 125 as follows. First, the above-described solar battery is inserted between sealing material 125 formed on transparent substrate 124 and sealing material 125 contained in container 128, and is subjected to vacuum compression bonding and the like while being heated, thereby compressing and bonding sealing material 125 provided on transparent substrate 124 and sealing material 125 contained in container 128 (step of compressing and bonding). In this way, the solar battery is contained in sealing material 125 filling a space surrounded by transparent substrate 124 and container 128.

Thereafter, sealing material 125 is hardened by further heating or the like (step of hardening), thus sealing the solar battery configured as above in sealing material 125 between transparent substrate 124 and container 128. Here, the hardening of sealing material 125 allows the electrodes of solar cell 100 and the wires of wiring substrate 200 to be compressed and bonded to each other mechanically, thus achieving more secured electric connection between the electrodes of solar cell 100 and the wires of wiring substrate 200. In this way, reliability of the connection is further improved.

Further, fabricating the solar cell module as described above does not require a step of applying a conductive adhesive agent and heating it in a reflow furnace. Hence, the number of steps can be reduced, whereby the solar cell module can be fabricated more easily.

Furthermore, in the case where the electrodes of solar cell 100 and the wires of wiring substrate 200 are connected to each other through conductive adhesive agent 108 as in the solar battery shown in FIG. 2, it is preferable to use a conductive adhesive agent having a melting temperature or hardening temperature of 180° C. or smaller, is more preferable to use a conductive adhesive agent having a melting temperature or hardening temperature of 150° C. or smaller, and is particularly preferable to use an Sn—Bi-based solder having a melting temperature of 150° C. or smaller.

Here, also in the case where the electrodes of solar cell 100 and the wires of wiring substrate 200 are connected to each other through conductive adhesive agent 108, the solar cell module can be fabricated by sealing the solar battery in sealing material 125 in the same way apart from the use of conductive adhesive agent 108.

In the case where a solder is used as conductive adhesive agent 108, the solder is preferably applied onto the wires of wiring substrate 200 and/or the electrodes of solar cell 100 through solder plating or soaking in a melted solder bath in advance and the electrodes of solar cell 100 and the wires of wiring substrate 200 are then brought into electric connection.

Further, in the case where a conductive adhesive agent formed of an Sn—Bi-based solder having a melting temperature or hardening temperature of 180° C. or smaller, more preferably 150° C. or smaller, particularly preferably having a melting temperature of 150° C. or smaller, is used, the electrodes of solar cell 100 and the wires of wiring substrate 200 can be electrically connected to each other with the conductive adhesive agent interposed therebetween during the step of compressing and bonding and/or the step of hardening, by for example heat generated in the step of compressing and bonding sealing material 125 and/or the step of hardening. Further, in this case, the solder has been applied in advance onto the wires of wiring substrate 200 and/or the electrodes of solar cell 100, thereby preventing production of a gas such as one generated when heating a cream solder. Although an extra step of applying conductive adhesive agent 108 is added, this method is preferable because the electric connection between the electrodes of solar cell 100 and the wires of wiring substrate 200 can be more secured by conductive adhesive agent 108.

As described above, in the case where the solar battery fabricated by electrically connecting the electrodes of solar cell 100 and the wires of wiring substrate 200 to each other is sealed in the sealing material to fabricate the solar cell module, the solar battery can be protected from application of heat, apart from heat generated while fixing them by adhesive agent 120 at a normal temperature as well as heat in the step of compressing and bonding sealing material 125 and/or in the step of hardening. This can reduce stress conventionally generated due to a difference in thermal expansion coefficient between a solar cell and a wire material of a wiring substrate. Accordingly, the solar cell can be prevented from being cracked, thus obtaining a thinner solar cell. Furthermore, influence of thermal stress during an actual operation of the solar cell module can be reduced too.

In addition, in order to prevent water vapor from entering the solar cell module, it is preferable to use a container 128 including a moisture penetration preventing layer such as metal film 127 formed of aluminum or the like which is greatly effective to prevent penetration of water vapor, as shown in the embodiment of FIG. 9. Entrance of water vapor into the solar cell module is likely to cause corrosion at interfaces between the electrodes of solar cell 100 and the wires of wiring substrate 200, or corrosion of conductive adhesive agent 108 provided between the electrodes of solar cell 100 and the wires of wiring substrate 200 (particularly, corrosion of the Sn—Bi-based solder). Hence, by using container 128 including the above-described moisture penetration preventing layer, the corrosion can be prevented effectively, thus achieving improved long-term reliability of the solar cell module.

As container 128 including the moisture penetration preventing layer, for example, as shown in the embodiment of FIG. 9, it is preferable to use a layered film in which metal film 127 formed of aluminum is interposed between insulative films 126 each formed of PET. For example, by covering the portions other than transparent substrate 124 with the layered film as shown in FIG. 9, water vapor can be effectively prevented from entering the solar cell module. For a portion, such as an end surface of the solar cell module, with which it is difficult for the layered film to be in intimate contact, a moisture penetration preventing tape such as a butyl rubber tape can be used to achieve complete intimate contact.

Thereafter, the wiring substrate of the above-described solar cell module and a terminal box may be connected using a conductive member, and the solar cell module may be fit in and surrounded by a frame body made of aluminum or the like.

EXAMPLES

Example 1

First, back-side electrode type solar cells each having a rear surface formed as shown in FIG. 3A were fabricated using a conventionally known method. Each solar-cell 100 was configured so that strip-shaped n electrodes 106 and p electrodes 107 were arranged alternately one by one on the rear surface of n type silicon substrate 101 having a light-receiving surface and a rear surface both having a shape of square with each side of 100 mm.

Then, the method shown in FIG. 5A-5C was employed to transfer wires made of copper to an adhesive agent 120 provided on an insulative substrate 111 made of PET. In this way, a wiring substrate 200 was fabricated. As adhesive agent 120, an acrylic-based viscous adhesive agent was used.

Figure 7:
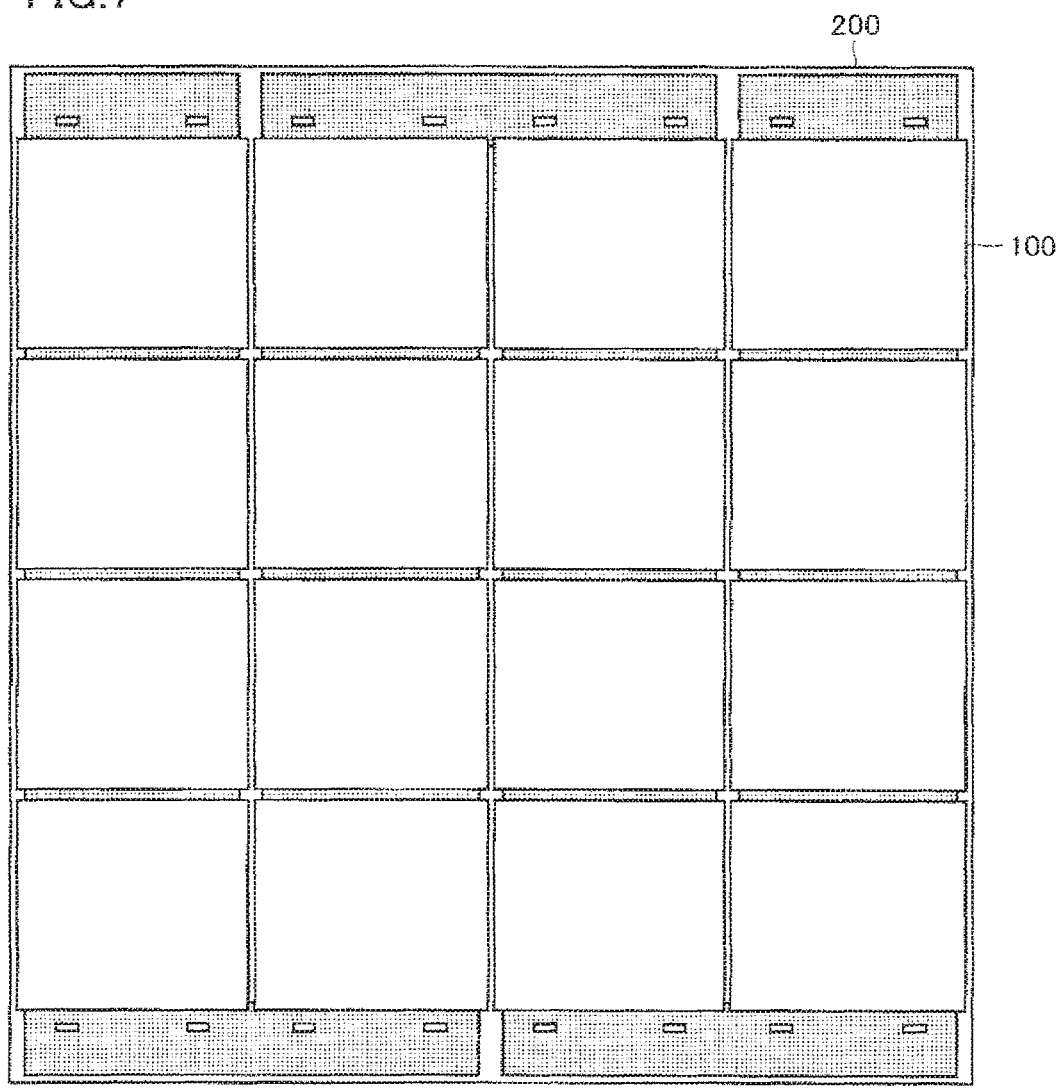
FIG. 7 is a schematic planar view of another exemplary solar battery of the present invention.

Then, as shown in FIG. 7, sixteen solar cells 100 were placed on one wiring substrate 200. In this way, a solar battery was fabricated in which solar cells 100 were fixed onto wiring substrate 200 by adhesive agent 120. In fabricating the solar battery, n electrodes 106 of each of sixteen solar cells 100 were placed on wires for n type 109 of wiring substrate 200 and p electrodes 107 of each solar cell 100 were placed on wires for p type 110 of wiring substrate 200, while using slits 112 of wiring substrate 200 as alignment marks for alignment thereof.

Thereafter, the solar battery fabricated as described above was sealed in a sealing material to fabricate a solar cell module as shown in FIG. 9. In fabricating the solar battery, the solar battery was interposed between a sealing material 125 made of an EVA resin and formed on a transparent substrate 124 constituted by a glass substrate and a sealing material 125 made of an EVA resin and contained in a container 128 constituted by a layered film in which a metal film 127 made of aluminum was interposed between insulative films 126 made of PET, was thereafter subjected to vacuum thermo-compression bonding to compress and bond sealing material 125 provided on transparent substrate 124 and sealing material 125 contained in container 128 (step of compressing and bonding), and thereafter sealing materials 125 were hardened by heating (step of hardening).

The step of compressing and bonding was performed by placing, on sealing material 125 contained in container 128, sealing material 125 formed on transparent substrate 124, and retaining them for seven minutes at 140° C. while evacuating it.

The step of hardening was performed after the step of compressing and bonding, by heating sealing materials 125 at 145° C. for 40 minutes to harden sealing materials 125 each made of an EVA resin. In this way, the electrodes of each solar cell 100 and the wires of wiring substrate 200 are in further intimate contact with each other.

Thereafter, the solar cell module fabricated as described above was connected to a terminal box, and was fit in and surrounded by a frame body made of aluminum.

By fabricating a solar module as described above, there can be fabricated a solar cell module having a solar battery, which is sealed therein and in which electrodes of a solar cell and wires of a wiring substrate are electrically connected to each other at a low temperature readily to attain highly reliable connection therebetween and relatively good electric characteristics. In addition, as insulative substrate 111, an inexpensive PET can be used. Furthermore, it can be fabricated without application of a conductive adhesive agent and heating with a reflow furnace, thus achieving reduction of the number of steps.

Example 2

First, back-side electrode type solar cells each having a rear surface formed as shown in FIG. 3A were fabricated using a conventionally known method. Each solar cell 100 was configured so that strip-shaped n electrodes 106 and p electrodes 107 were arranged alternately one by one on the rear surface of n type silicon substrate 101 having a light-receiving surface and a rear surface both having a shape of square with each side of 100 mm. Each of the solar cells was soaked in an Sn—Bi solder bath to coat the electrode portions with the solder.

Then, as shown in FIG. 8A, an acrylic-based viscous adhesive agent was applied to a portion of the rear surface of the solar cell other than the electrodes provided thereon, by means of screen printing. Thereafter, it was baked at 100° C., thus exhibiting viscosity of the viscous adhesive agent.

Then, as shown in FIG. 7, sixteen solar cells 100 were placed on one wiring substrate 200. In this way, a solar battery was fabricated in which solar cells 100 were fixed onto wiring substrate 200 by adhesive agent 120. In fabricating the solar battery, n electrodes 106 of each of sixteen solar cells 100 were placed on wires for n type 109 of wiring substrate 200 and p electrodes 107 of each solar cell 100 were placed on wires for p type 110 of wiring substrate 200, while using slits 112 of wiring substrate 200 as alignment marks for alignment thereof.

Because a layered film in which a metal film 127 made of aluminum was interposed between insulative films 126 each made of PET had been adopted in advance for the base material of wiring substrate 200, an EVA resin sheet and a glass substrate were provided on the solar battery having solar cells 100 fixed onto wiring substrate 200. Such a solar battery was then retained at 140° C. for seven minutes while being evacuated and thereafter was heated at 145° C. for 40 minutes to harden the EVA, thereby compressing, bonding, and sealing the solar battery to fabricate a solar cell module.

Through the above-described step of heating, the solder provided in advance to coat the electrodes of the solar cell was melted to connect the electrodes of the solar cell and the wires of the wiring substrates to each other, thus achieving more reliable connection therebetween.

Thereafter, the solar cell module fabricated as described above was connected to a terminal box, and was fit in and surrounded by a frame body made of aluminum.

It should be considered that the embodiments and examples disclosed herein are illustrative and non-restrictive in any respect. The scope of the present invention is defined by the scope of claims, and is intended to include any modifications within the scope and meaning equivalent to the terms of the claims.

INDUSTRIAL APPLICABILITY

According to the present invention, there can be provided a solar battery in which electrodes of a solar cell and wires of a wiring substrate can be electrically connected to each other at a low temperature readily to attain highly reliable connection therebetween and relatively good electric characteristics; a method for manufacturing the solar battery; a method for manufacturing a solar cell module using the solar battery; and the solar cell module.

The invention claimed is:

1. A solar battery, comprising:
at least a first and a second solar cell string, each of said first and second solar cell strings comprising at least two adjacent back-side electrode type solar cells connected in series, wherein the back-side electrode type solar cells include at least one back-side n-type electrode connected to an n-type impurity diffusion region of the solar cells and at least one back-side p-type electrode connected to a p-type impurity diffusion region of the solar cells; and a wiring substrate on which said first and second solar cell strings are disposed adjacent to one another;

wherein said wiring substrate includes an insulative base material having disposed thereon and contacting a first connection electrode for connecting adjacent solar cells of the first solar cell string in series, a second connection electrode for connecting adjacent solar cells of the second solar cell string in series, a first bus bar for connecting electrodes of a first solar cell of the first solar cell string at one end of the wiring substrate, a second bus bar for connecting electrodes of a first solar cell of the second solar cell string at said one end of the wiring substrate, and a third bus bar for connecting electrodes of a second solar cell of the first solar cell string and electrodes of a second solar cell of the second solar cell string at another end of the wiring substrate, the solar battery further comprising:

a non-conductive adhesive agent for adhering the back-side electrode type solar cells of the solar cell strings to the wiring substrate;

a sealing material sealing each of the first and second solar cell strings and the wiring substrate, wherein the sealing material provides an electrical connection between a wire of the wiring substrate and an electrode of the back-side electrode type solar cell through mechanical compression bonding;

a transparent substrate disposed on the sealing material on the solar cell side of the solar battery; and an insulative film disposed on the sealing material on the wiring substrate side of the solar battery.

2. The solar battery of claim 1, wherein each of said first and second connection electrodes are patterned on said insulative base material of the wiring substrate.

3. The solar battery of claim 2, wherein each of said first, second and third bus bars are patterned on said insulative base material of the wiring substrate.

4. A solar battery, comprising:

a plurality of solar cell strings, each solar cell string comprising at least two adjacent back-electrode type solar cells connected in series, wherein the back-electrode type solar cells include at least one back-side n-type electrode connected to an n-type impurity diffusion region of the solar cells and at least one back-side p-type electrode connected to a p-type impurity diffusion region of the solar cells;

a wiring substrate on which at least two solar cell strings of the plurality of solar cell strings are disposed adjacent to each other; and a non-conductive adhesive agent for adhering the back-side electrode type solar cells of the solar cell strings to the wiring substrate, wherein said wiring substrate includes an insulative base material having disposed thereon at least two solar cell strings arranged adjacent one another and connected in series between first and second bus bar electrodes disposed at one end of the wiring substrate, the adjacent solar cells within each solar cell string being connected to each other by respective connection electrodes disposed on and contacting the insulative base material of the wiring substrate, wherein electrodes of a last solar cell of a first solar cell string and electrodes of a first solar cell of a second solar cell string are connected to each other by a third bus bar electrode disposed at another end of the wiring substrate.

5. The solar battery of claim 4, wherein said connection electrodes are patterned on said insulative base material of the wiring substrate.

6. The solar battery of claim 5, wherein each of said first, second and third bus bars are patterned on said insulative base material of the wiring substrate.

7. The solar battery of claim 1, wherein the bus bars are visible from a light-receiving surface of the solar battery.

8. The solar battery of claim 4, further comprising a sealing material sealing the solar cell strings and the wiring substrate.

9. The solar battery of claim 8, further comprising a transparent substrate disposed on the sealing material on the solar cell side of the solar battery.

10. The solar battery of claim 8, further comprising an insulative film disposed on the sealing material on the wiring substrate side of the solar battery.

11. The solar battery of claim 4, wherein the bus bars are visible from a light-receiving surface of the solar battery.

\* \* \* \* \*